(12) United States Patent
Fuchs et al.

(10) Patent No.: US 9,654,131 B1
(45) Date of Patent: May 16, 2017

(54) CAPACITOR ORDER DETERMINATION IN AN ANALOG-TO-DIGITAL CONVERTER

(71) Applicant: TEXAS INSTRUMENTS DEUTSCHLAND GMBH, Freising (DE)

(72) Inventors: Thomas Fuchs, Munich (DE); Rüdiger Kuhn, Freising (DE); Bernhard Wolfgang Ruck, Freising (DE)

(73) Assignee: TEXAS INSTRUMENTS DEUTSCHLAND GMBH, Freising (DE)

( * ) Notice: Subject to any disclaimer, the term of this patent is extended or adjusted under 35 U.S.C. 154(b) by 0 days.

(21) Appl. No.: 15/054,220

(22) Filed: Feb. 26, 2016

(51) Int. Cl.
| | | |
|---|---|---|
| H03M 1/10 | (2006.01) | |
| H03M 1/46 | (2006.01) | |
| H03M 7/16 | (2006.01) | |

(52) U.S. Cl.
CPC ......... *H03M 1/1071* (2013.01); *H03M 1/466* (2013.01); *H03M 7/165* (2013.01)

(58) Field of Classification Search
CPC ...... H03M 1/462; H03M 1/466; H03M 1/667; H03M 1/687; H03M 1/804; H03M 1/806; H03M 1/1071; H03M 7/165
USPC .......................................... 341/118, 120, 172
See application file for complete search history.

(56) References Cited

U.S. PATENT DOCUMENTS

| | | | |
|---|---|---|---|
| 6,914,550 B2 | 7/2005 | Cai | |
| 7,746,262 B2 * | 6/2010 | Chowdhury | .......... H03M 1/462 341/161 |
| 7,777,662 B2 * | 8/2010 | Meynants | ............... H03M 1/14 341/155 |
| 8,477,052 B2 * | 7/2013 | Dey | ...................... H03M 1/109 341/118 |
| 9,041,569 B2 * | 5/2015 | Zhou | ................... H03M 1/0617 341/118 |
| 9,432,041 B2 * | 8/2016 | Giacomini | .......... H03M 1/0809 |
| 2010/0207791 A1 | 8/2010 | Ohnhaeuser et al. | |
| 2011/0148675 A1 | 6/2011 | Zhao et al. | |
| 2014/0070968 A1 | 3/2014 | Janakiraman et al. | |

OTHER PUBLICATIONS

McCreary et al., "WAM 3.1: A High-Speed, All-MOS Successive-Approximation weighted Capacitor A/D Conversion Technique," 1975 IEEE International Solid-State Circuits Conference, 3 p.
Texas Instruments, "Understanding Data Converters," Application Report, 1995 Mixed-Signal Products, 22 p.

* cited by examiner

*Primary Examiner* — Khai M Nguyen
(74) *Attorney, Agent, or Firm* — John R. Pessetto; Charles A. Brill; Frank D. Cimino

(57) ABSTRACT

An analog-to-digital converter (ADC) includes a digital-to-analog converter (DAC) that has a configurable capacitor array. Based on measurements of differential nonlinearity (DNL) and/or integral nonlinearity (INL) error by an external test computer system, an order for use of the DAC's capacitors can be determined so as to reduce DNL error aggregation, also called INL. The DAC includes a switch matrix that can be programmed by programming data supplied by the test computer system.

2 Claims, 5 Drawing Sheets

CAPACITOR ORDER DETERMINATION IN AN ANALOG-TO-DIGITAL CONVERTER

BACKGROUND

An analog-to-digital converter (ADC) converts an analog input signal (e.g., a voltage) to a digital output signal (also termed a "digital code" or simply a "code"). An ADC uniquely represents all analog inputs within a certain range by a limited number of digital output codes. Since the analog scale is continuous, while the digital code scale is discrete, there is a quantization process that introduces an error. That is, a small range of analog voltages will be resolved by the ADC to the same digital output code. As a result, a plot of analog input voltage versus digital output code has a stair step shape. The width of one step is defined as one least significant bit (LSB) and is often used as the reference unit for other quantities or units of the full analog range. For example, one-half LSB represents an analog quantity equal to one-half of the analog resolution.

Various types of errors exist in ADCs. Examples of such errors include offset error, gain error, differential nonlinearity (DNL) error, integral nonlinearity (INL) error, absolute accuracy error, and aperture error. Because an analog voltage is a continuous signal and a digital code is a discrete value, the relationship between digital output codes of an ADC and an analog input voltage has a stair step shape. For a digital-to-analog converter (DAC), analog output voltages are determined based on digital input codes resulting in step increases in voltage from one digital code to the next. The width of each step for an ADC is a function of the resolution of the ADC as well as component mismatches internal to the ADC. The DNL error refers to the difference between an actual step width between successive digital codes and the step width of an ideal ADC (or difference between step heights between an actual and ideal DAC). The step width of an ideal ADC may be referred to as "1 LSB." DNL error may be expressed in units of LSB. For example, a +½ LSB DNL error means that the step width is 50% larger than the ideal ADC step width.

INL error represents the deviation of the values on the actual transfer function from, in some representations, a straight line. The summation of the differential nonlinearities from bottom up to a particular step determines the value of the INL at that step. A plot of INL errors over the various digital codes may show sharp jumps in the INL errors between certain adjacent digital codes, referred to as "MSB (most significant bit) jumps."

While the relationship between the analog input and the digital output codes is linear for an ideal ADC, unfortunately DNL and INL errors result in a non-linear relationship between the analog input and the digital output codes.

BRIEF DESCRIPTION OF THE DRAWINGS

For a detailed description of various examples, reference will now be made to the accompanying drawings in which.

DETAILED DESCRIPTION

Figure 1:
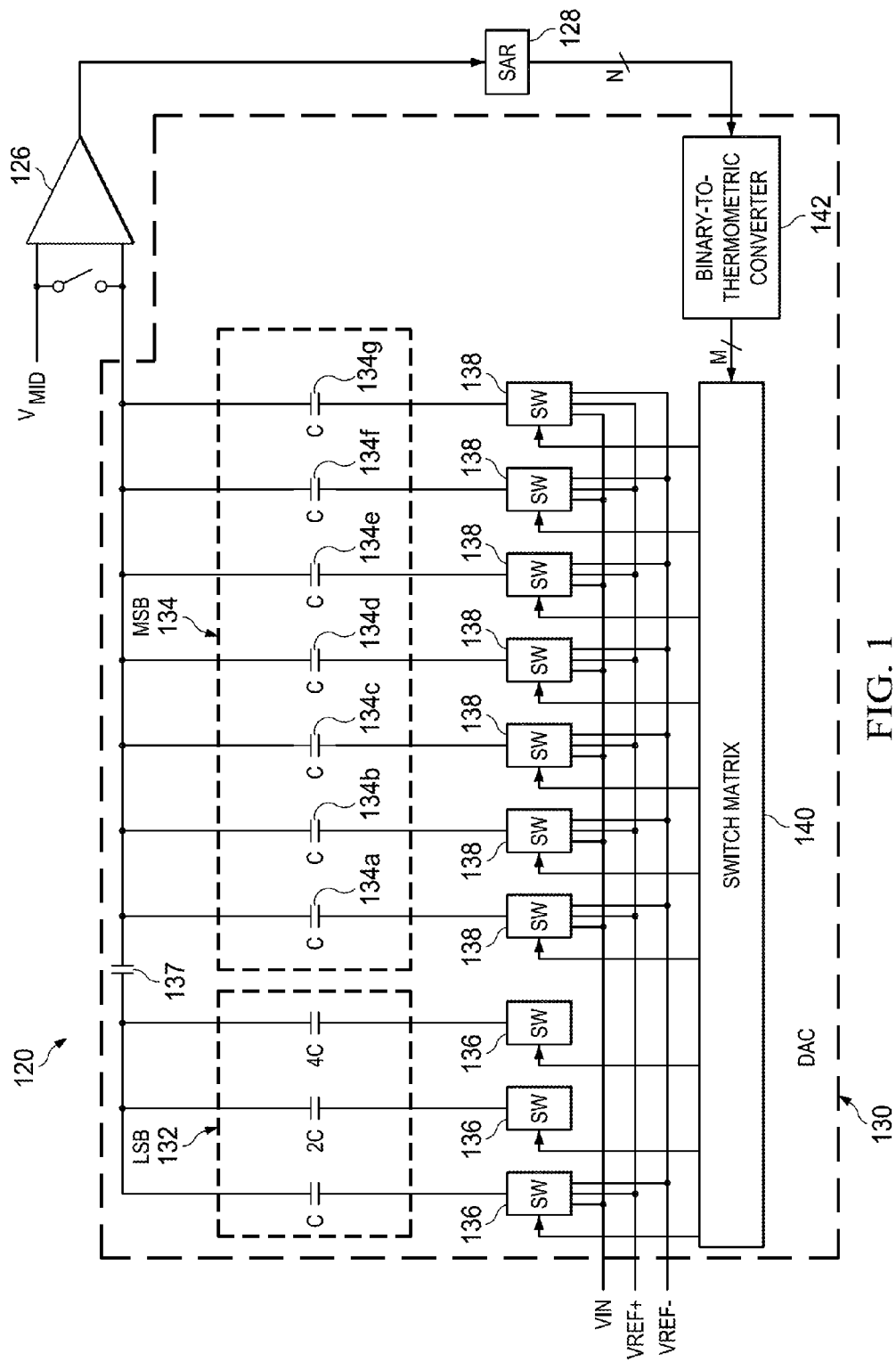
FIG. 1 shows a system diagram of a test computer system coupled to an ADC in accordance with various examples.

Certain terms are used throughout the following description and claims to refer to particular system components. As one skilled in the art will appreciate, different companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . " Also, the term "couple" or "couples" is intended to mean either an indirect or direct wired or wireless connection. Thus, if a first device couples to a second device, that connection may be through a direct connection or through an indirect connection via other devices and connections.

At least some ADCs include a digital-to-analog converter (DAC) that converts an intermediate digital code produced by a successive approximation register (SAR) internal to the ADC to an intermediate analog voltage. Many DACs include an array of capacitors that can be dynamically configured by switches coupled to the capacitors to form a capacitor divider network. Each switch may couple its respective capacitor to one of several voltages such as the analog input voltage, a positive reference voltage, or a negative reference voltage. Through an iterative successive approximation technique, each bit of the output digital code is determined in succession typically from the most significant bit to the least significant bit.

Some DACs include a MSB set of capacitors (also termed an "MSB capacitor array") and an LSB set of capacitors (termed an "LSB capacitor array"). In some implementations, the capacitors of the MSB capacitor array are all nominally the same (i.e., of the same capacitance value), while the LSB set of capacitors may be binary weighted (e.g., 4C, 2C, 1C). Some DACs operate according to a thermometric coding scheme in which a binary intermediate digital code from the SAR is converted to a thermometric intermediate digital code which comprises one bit for each capacitor in the MSB capacitor array. Through control of the switches of the various MSB capacitors specific proportions of a reference voltage can be generated and supplied to a comparator for comparing to the input voltage to thereby determine each bit of the digital output code.

While in an ideal ADC the MSB capacitors of a thermometrically-coded DAC are the same, in practice such is not the case due to tolerances and other manufacturing-related issues in fabricating the DAC. The capacitors of the MSB capacitor array are used in a prescribed order when converting an analog input signal to a digital output code. In accordance with various embodiments, the INL errors associated with the various MSB capacitors are measured during, for example, a production test. The ADC then receives programming data based on the measured INL errors that is used by the DAC to implement a particular order for use of the MSB capacitors during the successive approximation conversion process. The programming data is determined by a test computer system and transmitted by the test computer system into, for example, non-volatile storage in the ADC. During power-up of the ADC, the programming data may be used to configure an internal switch matrix to determine the coupling between the thermometer code bits to the various MSB capacitor switches. The programming data is generated so as to cause the MSB capacitors to be used in a predetermined order to avoid too many positive (or negative) DNL errors being strung together in succession. The configuration of the MSB capacitor array thus reduces the maximum accumulated INL error.

FIG. 1 shows an embodiment of an ADC 120 in accordance with various examples. The ADC 120 in this example includes a comparator 126, a SAR 128, a DAC 130, a switch matrix 240, and a binary-to-digital converter 142. An analog input voltage (VIN) is provided to switches 136 and 138 of the DAC 130. Through the switches, the input voltage VIN is sampled. The conversion of the analog input voltage VIN to a digital output code is an iterative process starting with the determination of the most significant bit, then the next most significant bit, and so on, until the least significant bit is determined. Each bit is determined by comparison of an intermediate voltage to a constant voltage serving as reference for sequential comparisons. If the intermediate voltage is larger than the constant reference, the output of the comparator will be a logic "0," otherwise the comparator out will be a logic "1." The output of the comparator represents the next bit in the iteratively computed digital output code.

The SAR 128 generates an intermediate binary code of n bits which is then provided to the binary-to-thermometric converter 142. The binary-to-thermometric converter 142 converts the intermediate binary code to a thermometer code of m bits (m is greater than n). The thermometer code is provided through the switch matrix 140 (more on the switch matrix later) to control inputs of the various switches 136 and 138. During the iterative conversion process, the switches 136, 138 are configurable to couple a positive reference voltage (VREF+) or a negative reference voltage (VREF−) to a terminal of a corresponding capacitor. The DAC 130 includes an LSB set of capacitors 132 and an MSB set of capacitors 134. The LSB set of capacitors 132 may be binary weighted as is indicated by the relative capacitor values of 1C, 2C, and 4C ("C" represents a unit of capacitance). The capacitors of the MSB set 134 nominally all have the same capacitance (C). Capacitor 137 couples the LSB capacitors 132 to the MSB capacitors 134.

The MSB capacitors 134 include capacitors 134a, 134b, 134c, 134d, 134e, 134f, and 134g. Although three LSB capacitors 132 and seven MSB capacitors 134 are shown in the example of FIG. 1, different numbers of LSB and MSB capacitors can be included in other embodiments. The number of capacitors is determined, at least in part, by the desired resolution for the ADC. Each MSB capacitor 134 couples to a corresponding switch 138. Each switch 138 is controlled by one of the thermometer code bits from the binary-to-thermometric converter 142. The control input to a given switch 138 can configure the switch to couple the corresponding capacitor 134 to any of VIN, VREF+, or VREF−.

In one example, the thermometer code causes zero to all of the MSB capacitors 134 to be coupled through their corresponding switches 138 to VREF+ while the remaining MSB capacitors are coupled through their corresponding switches 138 to VREF−. For example, for a 7-bit thermometric intermediate code, the possible intermediate code values can be as shown in the table below.

| Thermometer code |
|---|
| 0000000 |
| 0000001 |
| 0000011 |
| 0000111 |
| 0001111 |
| 0011111 |
| 0111111 |
| 1111111 |

A "1" means that the corresponding capacitor 134 is to be coupled to the positive reference voltage VREF+ and a "0" means that the corresponding capacitor 134 is to be coupled to the negative reference voltage VREF−. The thermometer code implies an order in which the capacitors are to be used to couple to the positive or negative reference voltages. For example, for the intermediate code 0000001, the rightmost capacitor 134g in FIG. 1 may be coupled to VREF+ through its switch 138, while the remaining six capacitors 134a-134f are coupled to VREF−. For the intermediate code 0000011, the rightmost two capacitors 134f and 134g in FIG. 1 may be coupled to VREF+, while the remaining five capacitors 134a-134e are coupled to VREF−, and so on.

In accordance with the disclosed embodiments, the order of use of the MSB capacitors 134a-134g can be determined based on a measurement of the DNL errors associated with the capacitors. The switch matrix 140 can implement the resulting order as explained below.

Figure 2:
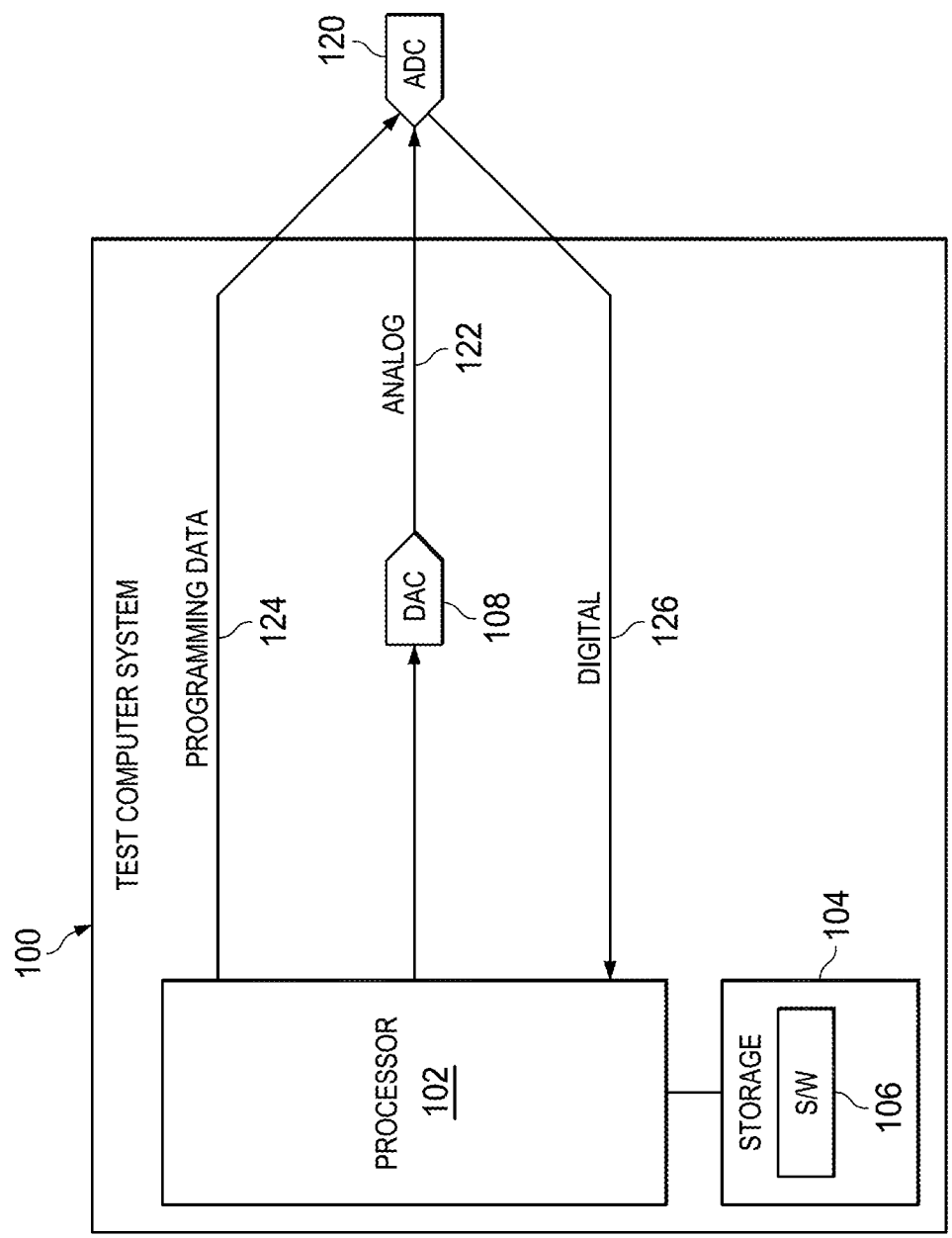
FIG. 2 shows a block diagram of the ADC in accordance with various examples.

In accordance with various embodiments, as shown in FIG. 2 the ADC 120 can be coupled to a test computer system 100. The test computer system 100 may include a processor 102, storage 104, and a DAC 108. The test computer system may be implemented as any type of computing system such as a laptop computer, a desktop computer, a custom-designed computing system, etc. The storage 104 may be implemented as non-transitory storage such as volatile memory (e.g., random access memory), non-volatile storage (e.g., magnetic storage, solid-state storage, etc.). The storage 104 includes software 106 which comprises machine instructions that can be executed by the processor 102 to perform at least some of the methods described herein.

Through execution of the software 106, the processor 102 is able to assert a series of digital codes to the DAC 108 to cause the DAC to generate an analog voltage to the ADC 120 on signal line 122. For example, the DAC 108 may be configured by the processor 102 to generate an analog voltage that ramps up or down between minimum and maximum permitted ADC input voltages. The ADC 120 converts the input analog voltage received on signal line 122 to digital output codes and provides the digital output codes back to the processor 102 of the test computer system 100 on signal line 126.

The processor 102 can measure DNL, INL, etc. based on the magnitude of the analog voltage provided to the ADC 120 and the resulting digital codes. For example, the processor 102 can ramp up the analog input voltage to the ADC and count the number of times it receives the same digital code. The DNL is the error of an individual step in the digital codes. For ADC 120 the DNL is the width of the analog input voltage range for which the processor 12 receives the same digital output code. The code count is then normalized by the average step width. The DNL error for code n is computed as:

$$DNL(n) = \frac{\text{actual step width} - \text{average step width}}{\text{average step width}}$$

For example, a DNL error of 25% for an individual step means that the analog voltage range where that particular code is 25% wider than the average analog voltage range for all codes. The INL error can be computed as the cumulative value of the DNL errors from an initial analog voltage (e.g., 0) until digital code n. That is, the INL is the sum of the DNL values until code n is reached.

The processor 102 thus can measure the DNL and INL by ramping the input voltage from the lowest ADC input voltage to the maximum permitted input voltage, and counting the number of digital codes that are output by the ADC 12 for each voltage range as noted above. The resulting data is simplified to take into account only the DNL for those code steps when the MSB code changes to result in a data set referred to as DNL_MSB. The 'jumps' mentioned here is the DNL. It is explained above how DNL may be calculated. The average of DNL_MSB is equal to the negative LSB error. The average may be subtracted from DNL_MSB to result in the DNL. The largest DNL is then used to compute an error_to_compensate value and an order for the capacitors is determined based, at least in part, on the DNL errors and the error_to_compensate value.

Once the capacitor order is determined, the processor 102 may transmit programming data 124 to the ADC 120. The programming data is used by the ADC to configure the switch matrix 140 (FIG. 1). The switch matrix 140 can couple any of the m bits of the thermometer code from the binary-to-thermometric converter 142 to any of the control inputs of the switches 134a-134g. How the programming data can be determined by the external test computer system 100 and how the switch matrix 140 is configured as a result are explained below.

Figure 3:
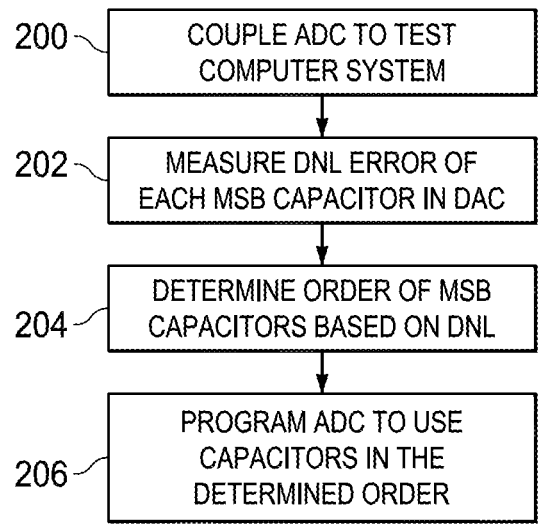
FIG. 3 shows a block diagram of a switch matrix of the ADC of FIG. 2 in accordance with various examples.

FIG. 3 illustrates a method which may be implemented by the test computer system 100. For example, the processor 102 may execute the software 106 to cause the various operations shown in FIG. 3 to be performed. At 200, the method includes coupling the ADC 120 to be programmed to the test computer system 100. This operation may be performed by placing the ADC in a test fixture (e.g., a socket) electrically coupled to the test computer system 100.

Figure 4:
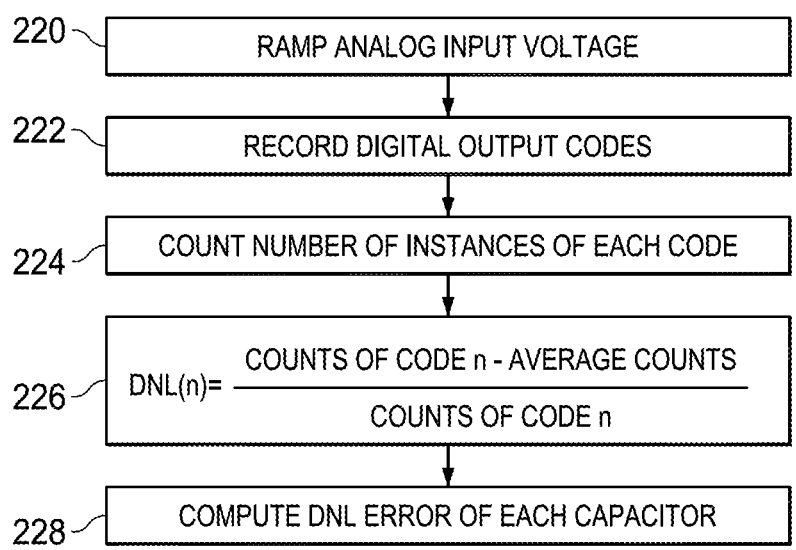
FIG. 4 shows a method of programming an ADC to reduce error in accordance with various examples.

At 202, the method includes measuring the DNL error of each MSB capacitor in the DAC 130 of the ADC 120. FIG. 4 shows one technique for computing the DNL error values. At 220, the processor causes the DAC 108 to ramp an analog input voltage to the ADC 120. The change in analog input voltage may be from a minimum voltage to a maximum voltage or vice versa. The digital output codes from the ADC 120 are received by the test computer system 100 at 222 and recorded. The number of instances of each recorded digital code is counted at 224. The DNL error of each code is computed at 226 as:

$$DNL(n) = \frac{\text{counts of code } n - \text{average counts}}{\text{counts of code } n}$$

At 228, the method then computes the DNL of each capacitor.

Figure 5:
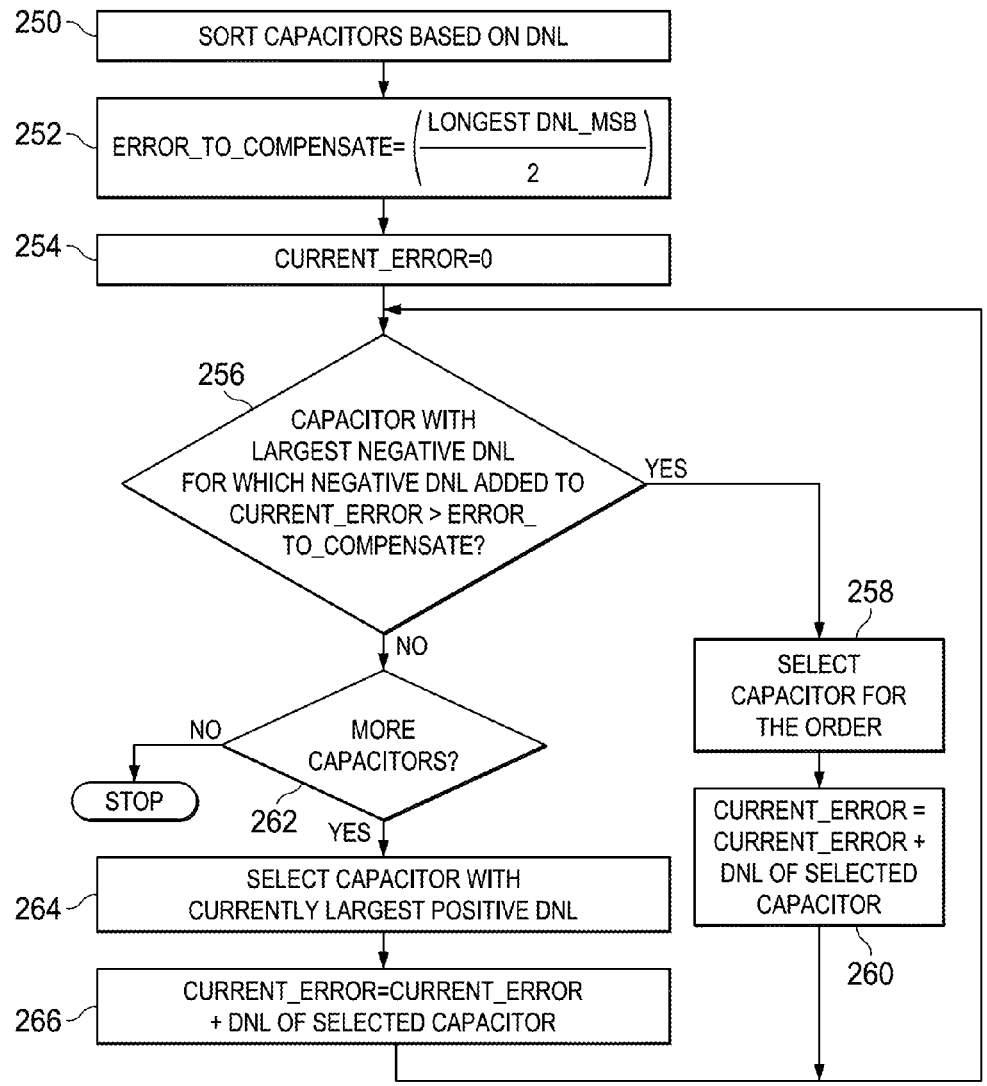
FIG. 5 shows a method of measuring INL errors in accordance with various examples.

Referring back to FIG. 3, after measuring the DNL, the method proceeds to operation 204 in which the order of the MSB capacitors 134 is determined based on the DNL. FIG. 5 shows an example of how to determine the capacitor order. The method of FIG. 5 will now be explained along with an example. Upon measuring the DNL in operation 228 of FIG. 4 for a particular ADC, the table below illustrates the resulting values for an 8-capacitor MSB capacitor array.

| Capacitor # | DNL_MSB | DNL | INL |
|---|---|---|---|
| 1 | 2 | 1.5 | 1.5 |
| 2 | −1 | −1.5 | 0 |
| 3 | 4 | 3.5 | 3.5 |
| 4 | −3 | −3.5 | 0 |
| 5 | 1 | 0.5 | 0.5 |
| 6 | −2 | −2.5 | −2 |
| 7 | 1 | 0.5 | −1.5 |
| 8 | 2 | 1.5 | 0 |
| | Average | Sum | |
| | 0.5 | 0 | |

The DNL values in the third column are the DNL_MSB values less the average DNL_MSB of 0.5. If the capacitors were used in the order shown from capacitor #1 through capacitor #8, the aggregation of the DNL errors would have a maximum positive value of +3.5 and a maximum negative value of −2 as shown in the INL error column (far right column of table above).

At 250 in FIG. 5, the method includes sorting the capacitor based on the DNL. The processor 102 may perform this operation and the resulting re-sorted capacitor order is as shown below.

| Capacitor # | DNL_MSB | DNL |
|---|---|---|
| 3 | 4 | 3.5 |
| 8 | 2 | 1.5 |
| 1 | 2 | 1.5 |
| 7 | 1 | 0.5 |
| 5 | 1 | 0.5 |
| 2 | −1 | −1.5 |
| 6 | 2 | −2.5 |
| 4 | −3 | −3.5 |
| | Average | Sum |
| | 0.5 | 0 |

At 252, the processor 102 computes the error_to_compensate value as the negative of one-half of the largest DNL_MSB (i.e., −(largest DNL_MSB)/2). In the example data set above, the largest DNL is 4 thereby resulting in an error_to_compensate value of −2 (computed as −4/2). The processor also initializes a "current_error" value to 0 at 254.

At 256, the processor then determines whether a capacitor exists in the data set that has not already been selected for the new order that matches a particular condition. The condition is that the DNL of the capacitor must be negative, must be the largest negative DNL remaining (to the extent that multiple capacitors remain with negative DNL), and, when that capacitor's negative DNL is added to the current_error is less than the error_to_compensate value (−2 in this example). The current_error value was initialized to 0 at operation 254 and thus the processor 102 searches for a capacitor with the largest negative DNL that is −2 as any negative DNL larger than −2, when added to a current_error of 0, will result in a value that is larger than the error_to_compensate of −2.

If such a capacitor exists as determined at 256, then control passes to operation 258 in which the processor selects that capacitor for the new order. From the sorted data set above, the processor selects capacitor #2 which has a negative DNL of −1.5. The DNL of −1.5 satisfies both conditions—it is a negative value and is the largest negative DNL that, when added to the current error does not exceed the error_to_compensate of −2. Capacitor 2 is thus the first capacitor in the new order.

At 260, the processor computes a new current_error value as the previous current_error value plus the DNL of the selected capacitor. The current_error value is 0 and the DNL of capacitor #2 is −1.5 and thus the updated current_error value is computed at 260 to be −1.5.

Control loops back to 256 to repeat this portion of the process and select the next capacitor for the new order to follow capacitor #2. The current_error value is now −1.5. Per operation 256, the processor 102 determines whether another capacitor remains to be selected that (a) has a negative DNL, (b) has the largest remaining negative DNL, and (c) has a negative DNL that, when added to the current_error does not cause the resulting current_error value to exceed the error_to_compensate. The current_error value is −1.5 and the error_to_compensate is −2. Only capacitor #6 and capacitor #4 remain to be selected and have negative DNL of −2.5 and −3.5, respectively. However, the largest remaining DNL −3.5 is large enough that, when added to the current_error value of −1.5 will exceed the error_to_compensate value of −2. As a result, control flows to operation 262.

At 262, the processor determines whether any more capacitors at all remain to be selected for the new order. If all capacitors have been selected at this point, then the process stops. As only capacitor #2 has thus far been selected, control flows to operation 264 in which, of the remaining capacitors, the capacitor with the largest positive DNL is selected. From the sorted capacitor data set above, the capacitor with the largest positive DNL is capacitor #3 having a positive DNL of +3.5. Capacitor #3 is thus selected at 264 to follow capacitor #2. At 266, the current_error value is updated again to add in the +3.5 DNL of the newly selected capacitor #3. As a result, current_error is computed to be −1.5+3.5=2.

Control loops back to operation 256 and the process repeats. The table below shows the resulting capacitor order.

| Order | Capacitor # | DNL_MSB | DNL  | INL  |
|-------|-------------|---------|------|------|
| 1     | 2           | −1      | −1.5 | −1.5 |
| 2     | 3           | 4       | 3.5  | 2    |
| 3     | 4           | −3      | −3.5 | −1.5 |
| 4     | 8           | 2       | 1.5  | 0    |
| 5     | 1           | 2       | 1.5  | 1.5  |
| 6     | 6           | −2      | −2.5 | −1   |
| 7     | 7           | 1       | 0.5  | −0.5 |
| 8     | 5           | 1       | 0.5  | 0    |

As can be seen the current_error value, which is the INL r resulting from the determined capacitor order has a maximum positive error of +2 LSB and a maximum negative error of −1.5 LSB. The maximum positive and negative accumulated DNL values from the original data set was +3.5 and −2.5 LSB, respectively, and thus the maximum positive and negative error has been reduced.

Figure 6:
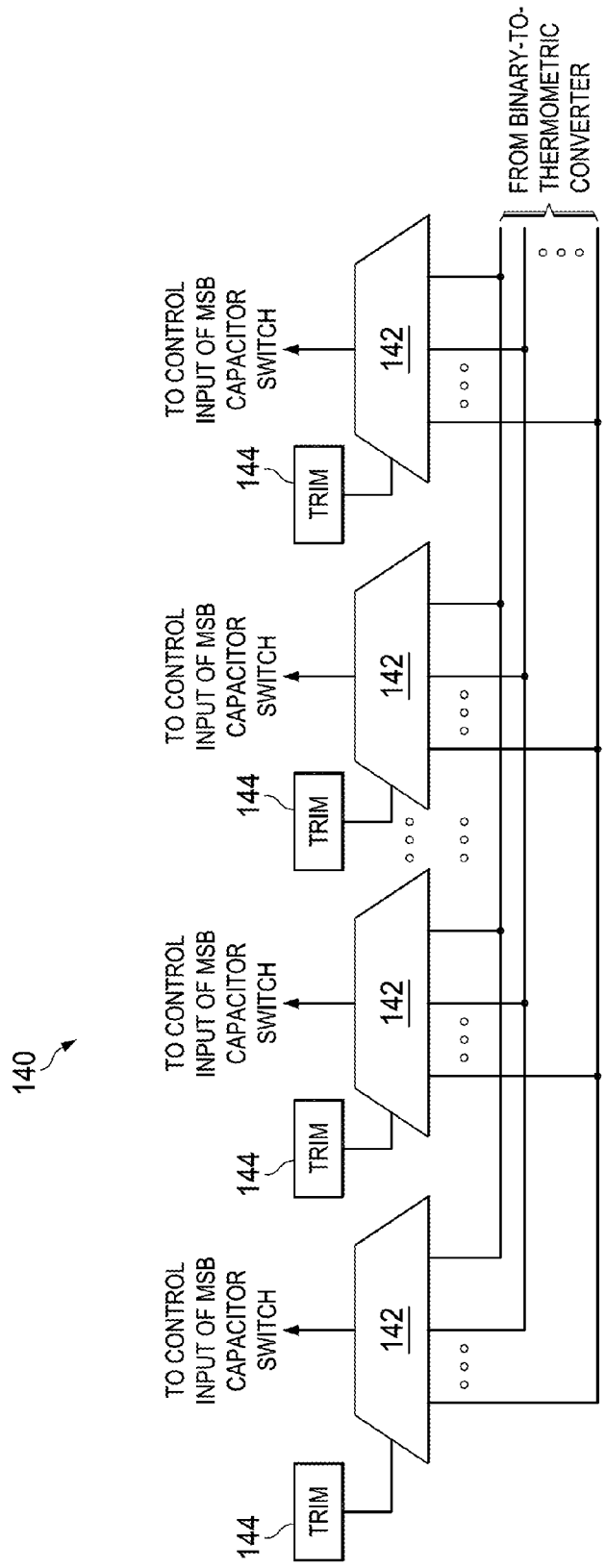
FIG. 6 shows a method of reordering a capacitor array of the ADC in accordance with various examples.

FIG. 6 shows an example of an implementation of the switch matrix 140 of the DAC 130. The switch matrix in this example includes a multiplexer 144 corresponding to at least each switch 138 of the MSB capacitor array 134. All of the bits of the of the thermometer code from the binary-to-digital converter 142 are provided to the inputs of the each multiplexer 144. That is, if the thermometer code is an 8-bit value then each multiplexer is an 8-to-1 multiplexer and can select any of the thermometer code bits to provide as an input control of the corresponding witch 138. The programming data 124 generated by the test computer system 100 is stored in non-volatile memory in the ADC 120 such as in trim data storage 144. The trim data from storage 144 provides a control signal to each multiplexer to specify which of its input thermometer code bits is to operate as the input control signal to the corresponding switch 138. The trim data may be read from storage 144 during an initialization process for the ADC 120 and used to configure each multiplexer 142.

In another embodiment of a switch matrix 140, the matrix may be implemented as a connection matrix in which electrical connections between thermometer code bits and individual capacitor switches 138 are formed during production, and after the measurement process described above. A mask may be used during the production process to implement the connections. This embodiment may be desirable for capacitor mismatches that tend to be the same among numerous ADC devices of a production run.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. A method comprising:
   measuring an error value for each of a plurality of capacitors in a digital-to-analog (DAC) capacitor array of an analog-to-digital converter (ADC);
   determining an order of the plurality of capacitors based on the measured error values; and
   programming the ADC to use the plurality of capacitors in the determined order during conversions of analog signals to digital codes;
   wherein the error value of each capacitor includes a differential nonlinearity (DNL) error, and wherein determining the order of the plurality of capacitors includes:
   sorting the plurality of capacitors based on the measured error values;
   computing an error_to_compensate value based on a DNL of one of the plurality of capacitors; and
   determining whether a capacitor remains to be selected for the order that is the capacitor of the plurality of capacitors that has the largest negative DNL, which when added to a current error value does not exceed the error_to_compensate;
      if a capacitor remains to be selected for the order that has the largest negative DNL that when added to the current error value does not exceed the error_to_compensate, selecting that capacitor, adding that capacitor's negative DNL to the current error value, and determining whether another capacitor remains to be selected for the order that has the largest negative DNL that when added to the current error value does not exceed the error_to_compensate; and
      if a capacitor does not remain to be selected for the order that has a negative DNL or, has a negative DNL but when added to the current error value exceeds the error_to_compensate, selecting a capacitor for the order that has the largest positive DNL, adding that capacitor's positive DNL to the current error value, and determining whether another capacitor remains to be selected for the order that has the largest negative DNL that when added to the current error value does not exceed the error_to_compensate.

2. A system comprising:
 a processor;
 a digital-to-analog converter (DAC) coupled to the processor and configured to provide analog signals to an analog-to-digital converter (ADC);
 storage coupled to the processor and containing executable code that, when executed by the processor, causes the processor to:
  measure an error value for each of a plurality of capacitors in a DAC capacitor array of the ADC;
  determine an order of the plurality of capacitors based on the measured error values; and
 program the ADC to use the plurality of capacitors in the determined order during conversions of analog signals to digital codes;
  wherein the error value of each capacitor includes a differential nonlinearity (DNL) error, and wherein, when executed, the executable code causes the processor to determine the order of the plurality of capacitors by sorting the plurality of capacitors based on the measured error values;
  wherein, when executed, the executable code causes the processor to:
  compute an error_to_compensate value based on a DNL of one of the plurality of capacitors; and
  determine whether a capacitor remains to be selected for the order that is the capacitor of the plurality of capacitors that has the largest negative DNL that when added to a current error value does not exceed the error_to_compensate;
 wherein, when executed, the executable code further causes the processor to:
  if a capacitor remains to be selected for the order that has the largest negative DNL that when added to the current error value does not exceed the error_to_compensate, selecting that capacitor, adding that capacitor's negative DNL to the current error value, and determining whether another capacitor remains to be selected for the order that has the largest negative DNL that when added to the current error value does not exceed the error_to_compensate; and
  if a capacitor does not remain to be selected for the order that has a negative DNL or, has a negative DNL but when added to the current error value exceeds the error_to_compensate, selecting a capacitor for the order that has the largest positive DNL, adding that capacitor's positive DNL to the current error value, and determining whether another capacitor remains to be selected for the order that has the largest negative DNL that when added to the current error value does not exceed the error_to_compensate.

* * * * *